United States Patent [19]
Derbenwick et al.

[11] Patent Number: 5,846,597
[45] Date of Patent: Dec. 8, 1998

[54] LIQUID SOURCE FORMATION OF THIN FILMS USING HEXAMETHYL-DISILAZANE

[75] Inventors: Gary F. Derbenwick; Larry D. McMillan; Narayan Solayappan; Michael C. Scott; Carlos A. Paz de Araujo; Shinichiro Hayashi, all of Colorado Springs, Colo.

[73] Assignees: Symetrix Corporation, Colorado Springs, Colo.; Matsushita Electronics Corporation, Japan

[21] Appl. No.: 876,305

[22] Filed: Jun. 16, 1997

Related U.S. Application Data

[62] Division of Ser. No. 714,774, Sep. 16, 1996.
[51] Int. Cl.$^6$ ........................................................ B05D 5/12
[52] U.S. Cl. ................ 427/96; 427/99; 427/299; 427/250; 427/255.3

[58] Field of Search .................................. 427/96, 99, 229, 427/250, 255, 255.3, 383.1

*Primary Examiner*—Brian K. Talbot
*Attorney, Agent, or Firm*—Duft, Graziano & Forest, P.C.

[57] ABSTRACT

A precursor liquid comprising several metal 2-ethylhexanoates, such as strontium, tantalum and bismuth 2-ethylhexanoates, in a xylenes/methyl ethyl ketone solvent is prepared, a substrate is placed within a vacuum deposition chamber, a small amount of hexamethyl-disilazane is added to the precursor liquid is misted, and the mist is flowed into the deposition chamber while maintaining the chamber at ambient temperature to deposit a layer of the precursor liquid on the substrate. The liquid is dried, baked, and annealed to form a thin film of a layered superlattice material, such as strontium bismuth tantalate, on the substrate. Then an integrated circuit is completed to include at least a portion of the layered superlattice material film in a component of the integrated circuit.

4 Claims, 6 Drawing Sheets

LIQUID SOURCE FORMATION OF THIN FILMS USING HEXAMETHYL-DISILAZANE

This application is a division of application Ser. No. 08/714,774, filed 16 Sep. 1996, now allowed.

BACKGROUND

1. Field of the Invention

The invention relates to a method of formation of thin films using liquid sources, and more particularly to the fabrication of thin films of metal-oxides of suitable thinness and quality of use in integrated circuits.

2. Statement of the Problem

It is known that liquid deposition processes, such as the process of misted deposition of a liquid precursor as described in U.S. Pat. No. 5,456,945 issued Oct. 10, 1995 and the spin-on process described in U.S. Pat. No. 5,423,285 issued Jun. 13, 1995, are useful in making integrated-circuit-quality thin films. It is also known that the misted deposition process has important advantages for the routine manufacture of integrated circuits. While the misted deposition process could be used to make good, integrated-circuit-quality, thin films of barium strontium titanate and other relatively simple metal oxides, when the process was used with more complex materials, such as the layered superlattice materials, high-quality films could be made only if the shapes of the thin film layers involved only flat structures, such as flat, uniform dielectric layers in capacitors. When the thin film structures involved sharp corners, such as in steps, the layered superlattice materials tended to fill the corners and not follow the contour of the underlying layers. In the integrated circuit art, this is expressed as not having good step coverage when used for layered superlattice materials. If the viscosity of the liquid source was adjusted to give better step coverage, then the quality of the film declined significantly, resulting in shorted layers and relatively poor electronic properties. However, state-of-the-art integrated circuits involve quite complex structures involving steps and other sharp corners. Thus, up to now, the use of the misted deposition process for layered superlattice materials has been limited. Since the layered superlattice materials have such extraordinary properties in integrated circuits, it would be highly desirable to have a misted deposition process that would allow the materials to be used in integrated circuits having complex structures.

SUMMARY OF THE INVENTION

The invention solves the above problems by providing hexamethyl-disilazane (HMDS) as a solvent in the liquid precursor used to deposit metal compounds. It has been found that the HMDS makes a substantial improvement in the step coverage resulting from the misted deposition of the layered superlattice materials. It has also been found to improve the step coverage of other metal oxides deposited in both the misted deposition process and the spin-on process, though the improvements are not as dramatic as those for the layered superlattice materials in the misted deposition process.

The invention provides a method of fabricating an integrated circuit including a thin film of a metal compound, the method comprising the steps of: providing an integrated circuit substrate; providing a liquid precursor including: at least one metal in effective amounts for forming a desired compound including the metal; and hexamethyl-disilazane; applying the liquid precursor to the substrate; treating the liquid layer deposited on the substrate to form a solid film of the desired metal compound; and completing the fabrication of the integrated circuit to include at least a portion of the metal compound in the electrical component of the integrated circuit. Preferably, the metal compound comprises a layered superlattice material. Preferably, the layered superlattice material comprises a material selected from the group consisting of strontium bismuth tantalate, strontium bismuth niobate, and strontium bismuth tantalum niobate. Preferably, the step of applying comprises: placing the substrate inside an enclosed deposition chamber; producing a mist of the liquid precursor; and flowing the mist through the deposition chamber to form a layer of the precursor liquid on the substrate. Preferably, the step of flowing is performed while maintaining the deposition chamber at ambient temperature. Preferably, the step of providing a precursor includes the step of adding an initiator having a boiling point between 50° C. and 100° C. to the precursor prior to the step of producing a mist. Preferably, the initiator comprises a solvent selected from the group consisting of methyl ethyl ketone, isopropanal, methanol, and tetrahydrofuran. Alternatively, the step of applying comprises using a spin-on process to apply the precursor to the substrate. Preferably, the liquid precursor comprises a solvent and a metal compound selected from the group consisting of metal alkoxides and metal carboxylates. Preferably, the step of treating includes one or more steps from the group of drying, baking and annealing the layer deposited on the substrate. Preferably, the liquid precursor includes a compound of the metal in a solvent, the solvent selected from the group consisting of xylene, n-butyl acetate, and 2-methoxyethanol. Preferably, the metal includes a metal selected from the group consisting of strontium, calcium, barium, bismuth, cadmium, lead, titanium, tantalum, hafnium, tungsten, niobium, zirconium, scandium, yttrium, lanthanum, antimony, chromium, and thallium.

In another aspect the invention provides a liquid precursor for forming a metal oxide, the precursor comprising: a plurality of metal moieties in effective amounts for forming a layered superlattice material upon application the precursor to a substrate and heating; and a solvent comprising hexamethyl-disilazane. Preferably, the solvent further includes a liquid selected from the group consisting of methyl ethyl ketone, isopropanal, methanol, tetrahydrofuran, xylene, n-butyl acetate, octane and 2-methoxyethanol.

In a further aspect, the invention provides a method of fabricating a thin film of a layered superlattice material, the method comprising the steps of: providing a liquid precursor including: a plurality of metal moieties in effective amounts for forming a layered superlattice material; and hexamethyl-disilazane; placing a substrate inside an enclosed deposition chamber; producing a mist of the liquid precursor; flowing the mist through the deposition chamber to form a layer of the precursor liquid on the substrate; and treating the liquid layer deposited on the substrate to form a solid film of the layered superlattice material. Preferably, the step of flowing is performed while maintaining the deposition chamber at ambient temperature. Preferably, layered superlattice material forms part of an electrical component in an integrated circuit, the method further including the step completing the fabrication of the integrated circuit to include at least a portion of the film of the layered superlattice material in the electrical component of the integrated circuit. Preferably, the layered superlattice material comprises a material selected from the group consisting of strontium bismuth tantalate, strontium bismuth niobate, and strontium bismuth tantalum niobate. Preferably, the metals include a metal selected from the group consisting of strontium, calcium, barium, bismuth, cadmium, lead, titanium, tantalum, hafnium, tungsten, niobium, zirconium, scandium, yttrium, lanthanum, antimony, chromium, and thallium.

The addition of hexamethyl-disilazane to the layered superlattice material precursor for the first time permits the fabrication of integrated circuits having layered superlattice material portions made in a misted deposition process that provides both excellent step coverage and excellent electronic properties. In contrast to the prior art, there is almost no variation in thickness of the layered superlattice material as it passes over the step. This substantial improvement in the results for the layered superlattice materials has led to the investigation of the use of HMDS for other materials and in other liquid deposition processes. In each case there has been some improvement of results. Numerous other features, objects and advantages of the invention will become apparent from the following description when read in conjunction with the accompanying drawings.

BRIEF DESCRIPTION OF THE DRAWING

FIG. I is a cutaway side view of the deposition chamber of the misted deposition apparatus used in the preferred embodiment of the invention

DETAILED DESCRIPTION OF THE PREFERRED EMBODIMENT

1. Overview

Figure 1:
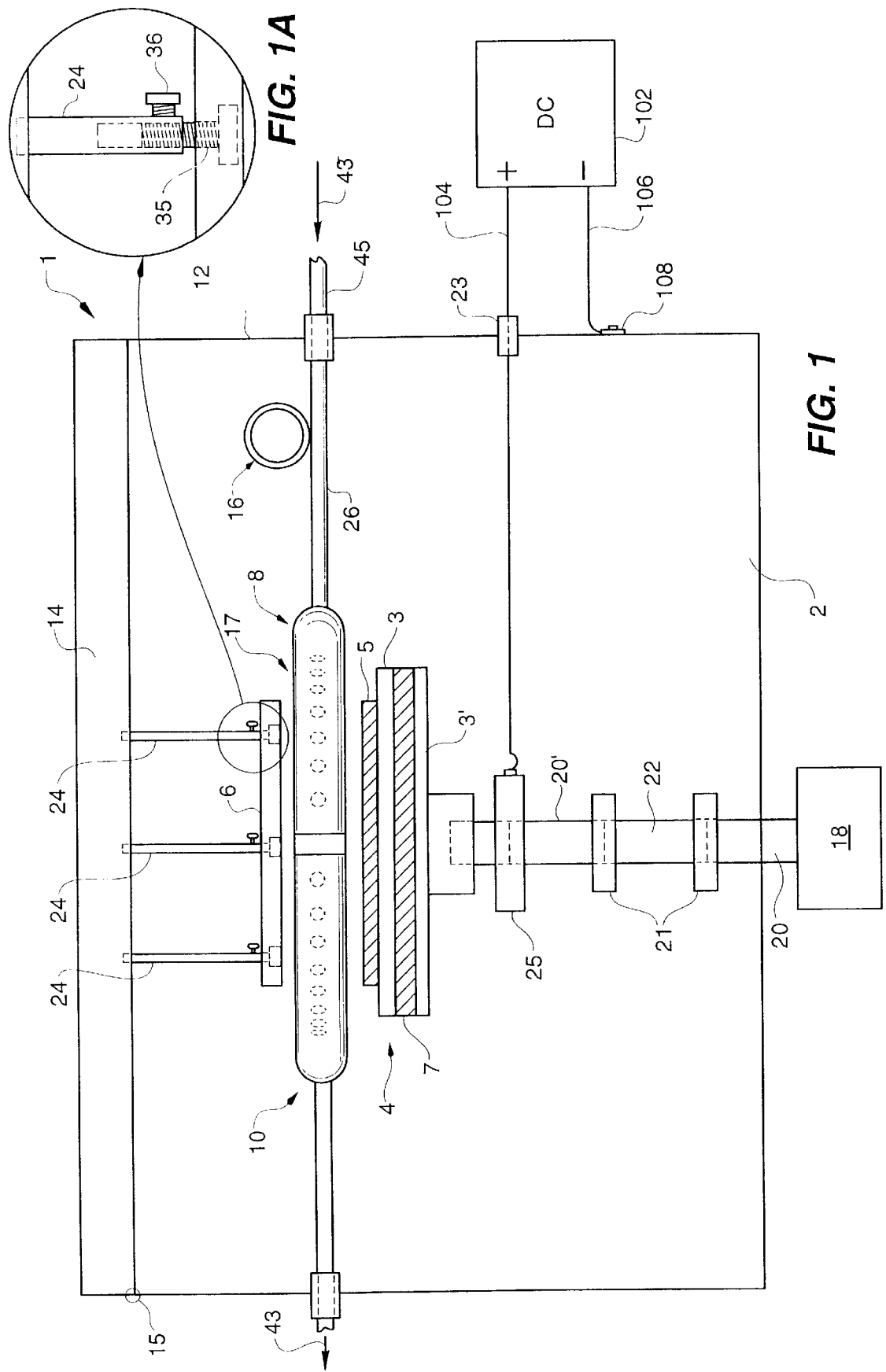
FIG. 1A is an enlarged view of a portion of FIG. 1.

According to a primary aspect of the present invention, a precursor liquid of a layered superlattice material, such as strontium bismuth tantalate, are initially prepared, a mist of the solution is generated, flowed into a deposition chamber, and deposited in a thin film layer or layers on a substrate disposed within the deposition chamber. As is conventional in the art, in this disclosure, the term "substrate" is used in a general sense where it includes one or number of layers 5 (FIG. 6) of material on which the layered superlattice material may be deposited, and also in a particular sense in which It refers to a silicon wafer 622 on which the other layers are formed. Unless otherwise indicated it means any object on which a layer of a layered superlattice material is deposited using the process and apparatus of the invention. Precursor liquids include sol-gel precursor formulations, which in general are comprised of metal-alkoxides in an alcohol solvent, and metallorganic precursor formulations, sometimes referred to as MOD formulations, which in general comprise a metal-carboxylate formed by reacting a carboxylic acid, such as n-decanoic acid or 2-ethylhexanoic acid, with a metal or metal compound in a solvent, combinations thereof, as well as other precursor formulations. Whatever the precursor, the invention includes the use of hexmethyl-disilazane as a precursor solvent or co-solvent.

The term "mist" as used herein is defined as fine drops of a liquid carried by a gas. The term "mist" includes an aerosol, which is generally defined as a colloidal suspension of solid or liquid particles in a gas. The term mist also includes a vapor, a fog, as well as other nebulized suspensions of the precursor solution in a gas. Since the above terms have arisen from popular usage, the definitions are not precise, overlap, and may be used differently by different authors. Herein, the term aerosol is intended to include all the suspensions included in the text *Aerosol Science and Technology*, by Parker C. Reist, McGraw-Hill, Inc., New York, 1983, which is hereby incorporated by reference. The term "mist" as used herein is intended to be broader than the term aerosol, and includes suspensions that may not be included under the term aerosol, vapor, or fog.

As discussed in the patents referenced above, the use of precursor liquids results in high quality of thin films because the precursor liquid can be accurately and consistently produced such that the desired chemical compound after deposition, is uniformly, stoichiometrically correct and because the deposition methods of the present invention do not involve violent chemical or physical reactions which either significantly destabilize the chemical compound of its predetermined molecular formulation or cause non-uniform deposition of the compound, cracking, etc. The misted deposition process also lends itself to large scale manufacturing of integrated circuits because it can consistently be reproduced and/or repeated for large numbers of wafers, and can be scaled to the size necessary for manufacturing of large numbers of wafers. As will be discussed in detail below, the use of hexamethyl-disilazane as a solvent or co-solvent results in excellent step coverage and excellent electronic properties for complex materials, such as the layered superlattice materials.

Layered superlattice materials are described in detail in U.S. Pat. No. 5,423,285 issued Jun. 13, 1995 and No. 5,519,234 issued May 21, 1996. In general, a layered superlattice material is defined as a material that can be described by a single chemical formula and which spontaneously forms itself into alternating layers having distinctly different crystalline structure. For example, strontium bismuth tantalate ($SrBi_2Ta_2O_9$) can be considered to be formed of alternating layers of a crystal structure similar to $Bi_2O_3$ and a crystal structure similar to $SrTa_2O_6$ although it must be kept in mind that $SrTa_2O_6$ has a tungsten bronze structure by itself, but within the layered material it has a Perovskite structure; Thus the layered structure is in reality a superlattice in which the structures of the individual sublattices of the Perovskite layers and the non-Perovskite layers are interdependent. These layered materials are natural superlattices, as compared to other superlattices, such as compositional superlattices, which are manufactured or forced superlattices. Thus, the term "layered superlattice material" is selected to distinguish these superlattice materials from alloy type superlattice materials, which are not layered, and superlattice heterostructures, i.e. the compositional superlattices, which are inherently not a "material" but rather layered structures made of at least two different materials having different chemical formulae.

The layered superlattice materials made by the process of the invention are polycrystalline. In the polycrystalline state, the structure of the materials includes grain boundaries, point defects, dislocation loops and other microstructure defects. However, within each grain, the structure is predominately repeatable units containing one or more ferroelectric layers and one or more intermediate non-ferroelectric layers spontaneously linked in an interdependent manner. Thus the layered superlattice materials of the invention which are ferroelectric can be defined as: (A) a material having a localized structure, within a grain or other larger or smaller unit, which localized structure contains predominately repeatable units containing one or more ferroelectric layers and one or more intermediate non-ferroelectric layers spontaneously linked in an interdependent manner. The invention also includes materials that are not ferroelectric, and those that include Perovskite-like layers can be included in the following definition: (B) a material having a localized structure, within a grain or other larger or smaller unit, which localized structure contains predominately repeatable units containing one or more Perovskite-like layers and one or more intermediate non-Perovskite-like layers spontaneously linked in an interdependent manner.

The layered superlattice materials include layered Perovskite-like materials catalogued by Smolenskii et al. in *Ferroelectrics and Related Materials*, ISSN 0275-9608, (V.3 of the series Ferroelectrics and Related Phenomena, 1984) edited by G. A. Smolenskii, Sections 15.3–15.7 and include:

(I) compounds having the formula $A_{m-1}Bi_2M_mO_{3m+3}$, where $A=Bi^{3+}$, $Ba^{2+}$, $Sr^{2+}$, $Ca^{2+}$, $Pb^{2+}$; $K^+$, $Na^+$ and other ions of comparable size, and $M = Ti^{4+}$, $Nb^{5+}$, $Ta^{5+}$, $Mo^{6+}$, $W^{6+}$, $Fe^{3+}$ and other ions that occupy oxygen octahedral; this group includes bismuth titanate, $Bi_4Ti_3O_{12}$;

(II) compounds having the formula $A_{m+1}M^m O_{3m+1}$, including compounds such as strontium titanates $Sr_2TiO_4$, $Sr_3Ti_2O_7$ and $Sr_4Ti_3O_{10}$; and (III) compounds having the formula $A_mM_mO_{3m+2}$, including compounds such as $Sr_2Nb_2O_7$, $La_2Ti_2O_7$, $Sr_5TiNb_4O_{17}$, and $Sr_6Ti_2Nb_4O_{20}$. It is noted that in the case of $Sr_2Nb_2O_7$ and $La_2Ti_2O_7$ the formula needs to be doubled to make them agree with the general formula. Layered superlattice materials include all of the above materials plus combinations and solid solutions of these materials.

Layered superlattice materials may be summarized more generally under the formula:

(1) $A1_{w1}^{+a1} A2_{w2}^{+a2} \ldots Aj_{wj}^{+aj} S1_{x1}^{+s1} S2_{x2}^{+s2} \ldots Sk_{+k}^{+sk} B1_{y1}^{+b1} B2_{y2}^{+b2} \ldots B1_{y1}^{+b1} Q_z^{-2}$, where A1, A2 . . . Aj represent A-site elements in the Perovskite-like structure, which may be elements such as strontium, calcium, barium, bismuth, cadmium, lead, and others S1, S2 . . . Sk represent superlattice generator elements, which usually is bismuth, but can also be materials such as yttrium, scandium, lanthanum, antimony, chromium, thallium, and other elements with a valence of +3, B1, B2 . . . B1 represent B-site elements in the Perovskite-like structure, which may be elements such as titanium, tantalum, hafnium, tungsten, niobium, zirconium, and other elements, and Q represents an anion, which generally is oxygen but may also be other elements, such as fluorine, chlorine and hybrids of these elements, such as the oxyfluorides, the oxychlorides, etc. The superscripts in formula (1) indicate the valences of the respective elements, and the subscripts indicate the number of moles of the material in a mole of the compound, or in terms of the unit cell, the number of atoms of the element, on the average, in the unit cell. The subscripts can be integer or fractional. That is, formula (1) includes the cases where the unit cell may vary throughout the material, e.g. in $Sr_{0.75}Ba_{0.25}Bi_2Ta_2O_9$, on the average, 75% of the time Sr is the A-site atom and 25% of the time Ba is the A-site atom. If there is only one A-site element in the compound then it is represented by the "A1" element and w2. . . wj all equal zero. If there is only one B-site element in the compound, then it is represented by the "B1" element, and y2. . . yl all equal zero, and similarly for the superlattice generator elements. The usual case is that there is one A-site element, one superlattice generator element, and one or two B-site elements, although formula (1) is written in the more general form since the invention is intended to include the cases where either of the sites and the superlattice generator can have multiple elements. The value of z is found from the equation:

(2) $(a1w1+a2W2 \ldots +ajwj)+(s1 \times 1+s2 \times 2 \ldots +sk \times k)+(b1 y1 +b2y2 \ldots +bjyj)=2z$. Formula (1) includes all three of the Smolenskii type compounds: for the type I material, $w1=m-1$, $\times 1=2$, $y1=m$, $z=3m+3$ and the other subscripts equal zero; for the type II material, $w1=m+1$, $y1 =m$, $z=3m+1$, and the other subscripts equal zero; for the type III material, $w1=m$, $y1=m$, $z=3m+2$, and the other subscripts equal zero. It is noted that the Smolenskii type I formula does not work for M=Ti and m=2, while the formula (1) does work. This is because the Smolenskii formula does not consider valences. The materials according to the invention do not include all materials that can be fit into formula (1), but rather only those materials that spontaneously form layered superlattices. In summary, the materials of the invention include all the materials as described by the definitions (A) and (B) above, the Smolenskii formulas, and the formula (1), plus solid solutions of all the foregoing materials. Terms of art that have been applied to these structures include layered perovskite-like materials, recurrent intergrowth layers, Aurivilius materials, and self-orienting spontaneous intergrowth layers. Even so, no one single term suffices to describe the entire class of layered superlattice materials. Applicants have chosen the term "layered superlattice materials" to describe the entire class of materials because the lattices include a short range order, e.g., a sublayer formed of a perovskite-like oxygen octahedra lattice, and a long range order including a periodic repetition of sublayers, e.g., a perovskite-like sublayer and a superlattice generator metal oxide layer repeated in succession. Further, as in other superlattice materials, the length of the periodicity can be manipulated. For example, as is known in the art of these materials, by adjusting the stoichiometry, the value of "m" in the Smolenskii formulas I, II, and III above can be varied to vary the thickness of the perovskite-like layers. See, *Ferroelectrics and Related Materials*, ISSN 0275-9608, (V.3 of the series Ferroelectrics and Related Phenomena, 1984) edited by G. A. Smolenskii, p. 694. The dual order of these periodically repeating structures and the ability to manipulate the periodic distances meets the definition of a superlattice. As indicated above, the term "layered superlattice material" should not be confused with forced heterolattice structures that are made by sputter deposition of successive layers. Layered superlattice materials spontaneously form collated intergrowth layers in an anneal, and do not require the forced deposition of successive layers.

According to the preferred embodiment of the present invention, the mist of a precursor liquid is evenly flowed across and onto a substrate at substantially ambient temperature. That is, unlike the prior art, the substrate is not heated. In this disclosure the term "ambient" means at the temperature of the surroundings, which preferably is room temperature, which is generally between 15° C. and 40° C. However, because various processes may be occurring during the deposition, such as drawing a vacuum, electrical poling, and/or the application of ultraviolet radiation, the actual temperature within deposition chamber 2 may vary from the temperature of the room in which the deposition takes place. Thus the use of the words "substantially ambient temperature". Substantially ambient temperature means generally within the range of −50° C. and 100° C. As will discussed further below, a key aspect of the flow process is that the mist is flowed across the substrate via multiple input ports and exits the area above the substrate via multiple exhaust ports, with the ports being distributed in close proximity to and about the periphery of the substrate to create a substantially evenly distributed flow of mist across the substrate.

Another feature of the deposition process is that it is a relatively low energy process as compared to prior art deposition processes. It is believed that the deposition is caused by relatively low energy kinetic interactions between the liquid particles and also relatively low energy kinetic interactions between the particles and the barrier plate opposite the substrate. It has been found that heating the deposition chamber or substrate during deposition leads to inferior quality thin films. During, after, or both during and after deposition, the precursor liquid is treated to form a thin film of solid layered superlattice material on the substrate. In this context, "treated" means any one or a combination of the following: exposed to vacuum, ultraviolet radiation, electrical poling, drying, heating, and annealing. In the preferred embodiment UV radiation and electrical poling are optionally applied to the precursor solution during deposition. The ultraviolet radiation is preferably also applied after deposition. After deposition, the material deposited on the substrate, which is liquid in the preferred embodiment, is preferably exposed to vacuum for a period, then is heated, and then annealed. The preferred process of the invention is one in which the misted precursor solution is deposited directly on the substrate and the dissociation of the organics in the precursor that do not form part of the desired material and removal of the solvent and organics or other fragments takes place primarily after the solution is on the substrate. However, in another aspect the invention also contemplates a process in which the final desired chemical compound or an intermediate compound is separated from the solvent and organics during the deposition and the final desired chemical compound or an intermediate compound is deposited on the substrate. In both aspects, preferably, one or more bonds of the precursor pass through to the final film.

An important parameter of many complex thin films used in integrated circuits, such as ferroelectric films, is that they are generally required to be quite thin, for example, within a range of 200 angstroms–5000 angstroms. Such film thicknesses can be readily achieved by the process and apparatus according to the invention. The invention can also be used to generate much thicker films, if desired.

Figure 5:
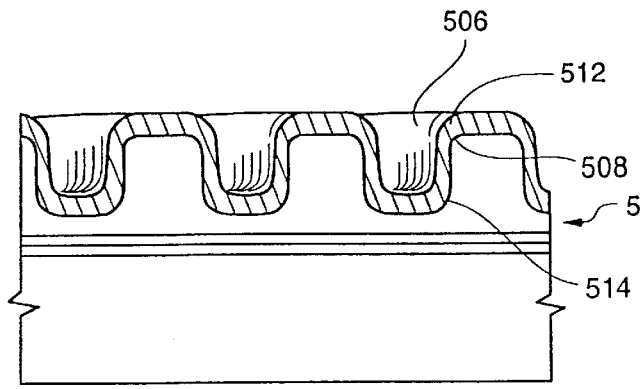
FIG. 5 is a drawing of an electron micrograph of an integrated circuit device fabricated with the process of the invention showing the step coverage of a thin film of strontium bismuth tantalate applied to a substrate.
Figure 6:
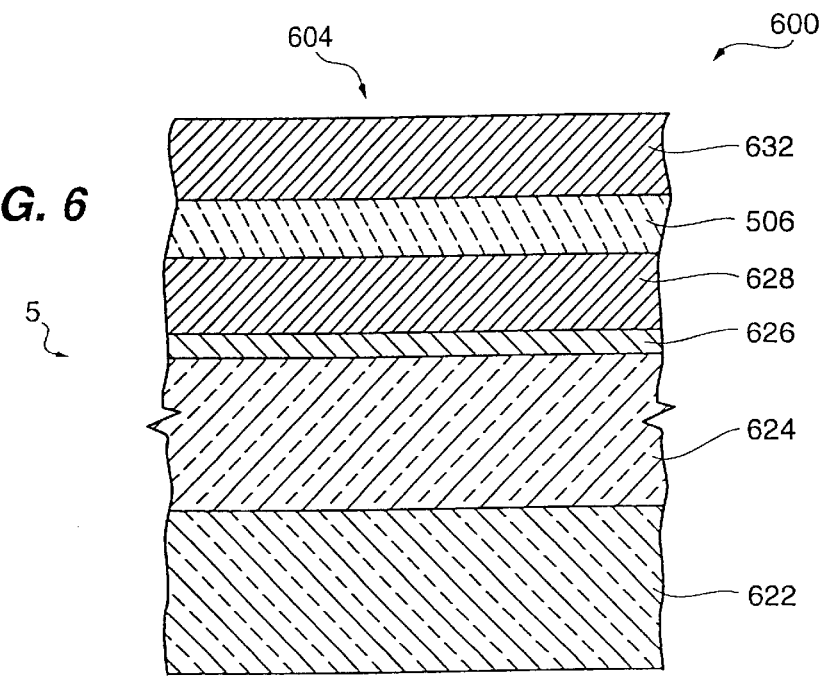
FIG. 6 shows a cross-sectional view of a portion of an integrated circuit capacitor fabricated utilizing the method of the invention.

FIG. 5 is a drawing of an electron micrograph of an actual device fabricated according to the process of the invention utilizing the apparatus of the invention. This drawing illustrates the step coverage of a thin film 506 of strontium bismuth tantalate applied to a substrate 5. Because of the relative thinness of the strontium bismuth tantalate layer 506, it is not possible to show all the details of the substrate 5 in a photomicrograph. Thus, a schematic diagram intended to represent a cross-section of an integrated circuit, is shown in FIG. 6. So that all the layers can be shown in one drawing, the relative thicknesses of the various layers are not drawn to the same scale in FIG. 6. As shown in FIG. 6, the substrate 5 includes a silicon wafer 622, a layer 624 of $SiO_2$ about 5000 Å (Angstroms) thick, a layer 626 of titanium about 200 Å thick, and a layer 628 of platinum about 2000 Å thick. In the actual capacitor, after the layer 506 of the layered superlattice material is deposited, another approximately 2000 Å thick layer 632 of platinum is deposited, then the capacitor is patterned to complete the device.

As shown in FIG. 5, a step 508 is formed in substrate 5 over which the layer 506 of strontium bismuth tantalate was deposited using the method of the present invention. Note that the deposition of the applied layered superlattice material 506 is extremely conformal over the top 512 and bottom 514 of step 508. There is a small amount of filling in of the hard angle near the bottom 514 of the step 508, but this filling in is substantially less than for layered superlattice materials deposited without hexamethyl-disilazane as a solvent, and compares well to the conformation possible in state-of-the-art integrated circuit deposition techniques commonly used in the fabrication of integrated circuits. Thus, the addition of hexamethyl-disilazane as a solvent solves the problem of it not being possible to obtain the excellent electronic properties of layered superlattice materials in combination with the complex structures of state-of-the art integrated circuits.

Figure 7:
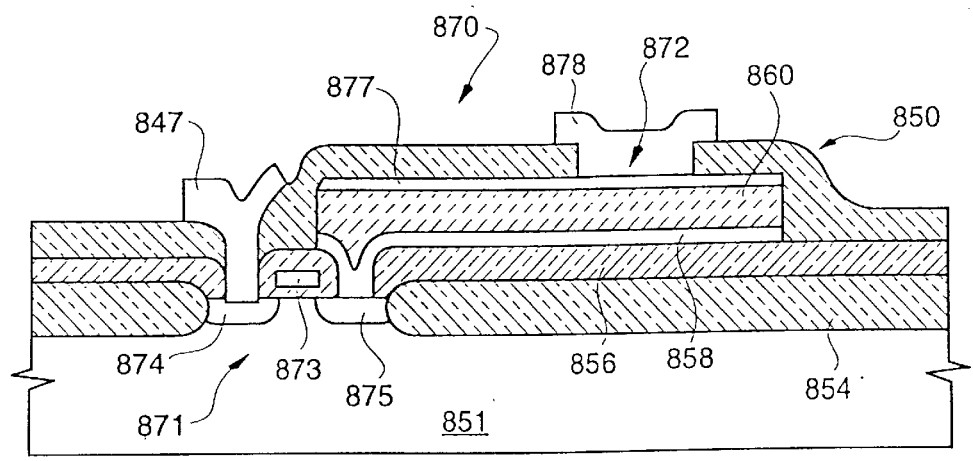
FIG. 7 shows an cross-sectional view of a DRAM memory cell made with a layered superlattice material.

A dynamic random access memory (DRAM) cell 770 utilizing the layered superlattice material is shown in FIG. 7. As is well-known, a DRAM memory is made up of hundreds of thousands or millions of such cells. Portions of the circuit wafer 850, particularly the layer 860, may be formed utilizing the apparatus and process of the invention. When the layer 860 is a ferroelectric layered superlattice material, such as strontium bismuth tantalate, the cell is a non-volatile ferroelectric (FERAM) switching memory cell, and when the layer 860 is a dielectric layered superlattice material, such as lead bismuth niobate, the cell 870 is a volatile DRAM memory cell. The wafer 850 includes a silicon substrate 851, field oxide areas 854, and two electrically interconnected electrical devices, a transistor 871 and a capacitor 872. Transistor 871 includes a gate 873, a source 874, and a drain 875. Capacitor 872 includes first electrode 858, layered superlattice material 860, and second electrode 877. Insulators, such as 856, separate the devices 871, 872, except where drain 875 of transistor 871 is connected to first electrode 858 of capacitor 872. Electrical contacts, such as 847 and 878 make electrical connection to the devices 871, 872 to other parts of the integrated circuit 850. A detailed example of the complete fabrication process for an integrated circuit memory cell as shown in FIG. 7 is given in U.S. Pat. No. 5,466,629 issued Nov. 14, 1995. The detailed preferred process for fabricating the layer 860 is given below. The process of the invention discussed herein may also be utilized in forming other layers of wafer 850, such as insulating layers 856.

A thin film deposition apparatus 1 according to one exemplary embodiment of the invention is shown in FIG. 1 and 1A. Apparatus 1 comprises a deposition chamber 2 containing a substrate holder 4, a barrier plate 6, an input nozzle assembly 8, an exhaust nozzle assembly 10, and an ultraviolet radiation source 16. The deposition chamber 2 includes a main body. 12, a lid 14 which is securable over the main body 12 to define an enclosed space within the deposition chamber 2. The chamber is connected to a plurality of external vacuum sources which will not be described in detail herein. Lid 14 is pivotally connected to the main body 12 using a hinge as indicated at 15. In operation, a mist and inert carrier gas are fed from manifold assembly 40 (FIG. 3) via tube 45, in direction 43, and pass to input nozzle assembly 8, where the mist is deposited onto substrate 5. Excess mist and carrier gas are drawn out of deposition chamber 2 via exhaust nozzle 10.

Substrate holder 4 is made from two circular plates 3, 3' of electrically conductive material, such as stainless steel, the top plate 3 being insulated from the bottom plate (field plate) 3' by an electrically insulative material, such as delrin. In an exemplary embodiment, utilizing a 4 inch diameter substrate, substrate holder 4 is nominally 6 inches in diameter and supported on a rotatable shaft 20 which is in turn connected to a motor 18 so that holder 4 and substrate 5 may be rotated during a deposition process. An insulating shaft 22 electrically insulates the substrate holder 4 and substrate 5 supported thereon from the DC voltage applied to the deposition chamber main body 12 so that a DC bias can be created between the substrate holder 4 and barrier plate 6 (via chamber main body 12). Such a DC bias may be utilized, for example, for field-poling of thin films as they are being deposited on the substrate 5. Insulating shaft 22 is connected to shaft 20 and shaft 20' by couplings 21. Electrical source 102 is operatively connected to main body 12 of deposition chamber 2 at connection 108 by lead 106 and via feedthrough 23 to brass sleeve 25 by lead 104 to effect a DC bias between field plate 3' and barrier plate 6.

Barrier plate 6 is made of an electrically conductive material such as stainless steel, and is of sufficiently large size to extend substantially over the substrate 5 in parallel thereto so that a vaporized source or mist as injected through input tube 26 and nozzle assembly 8 is forced to flow between barrier plate 6 and the substrate holder 4 over the substrate 5. Barrier plate 6 is preferably the same diameter as the substrate holder 4. The barrier plate 6 is preferably connected to the lid 14 by a plurality of rods 24 so that the plate 6 will be moved away from the substrate 5 whenever the lid is opened. The barrier plate 6 also includes a UV transmitting window (not shown in FIG. 1).

Figure 2:
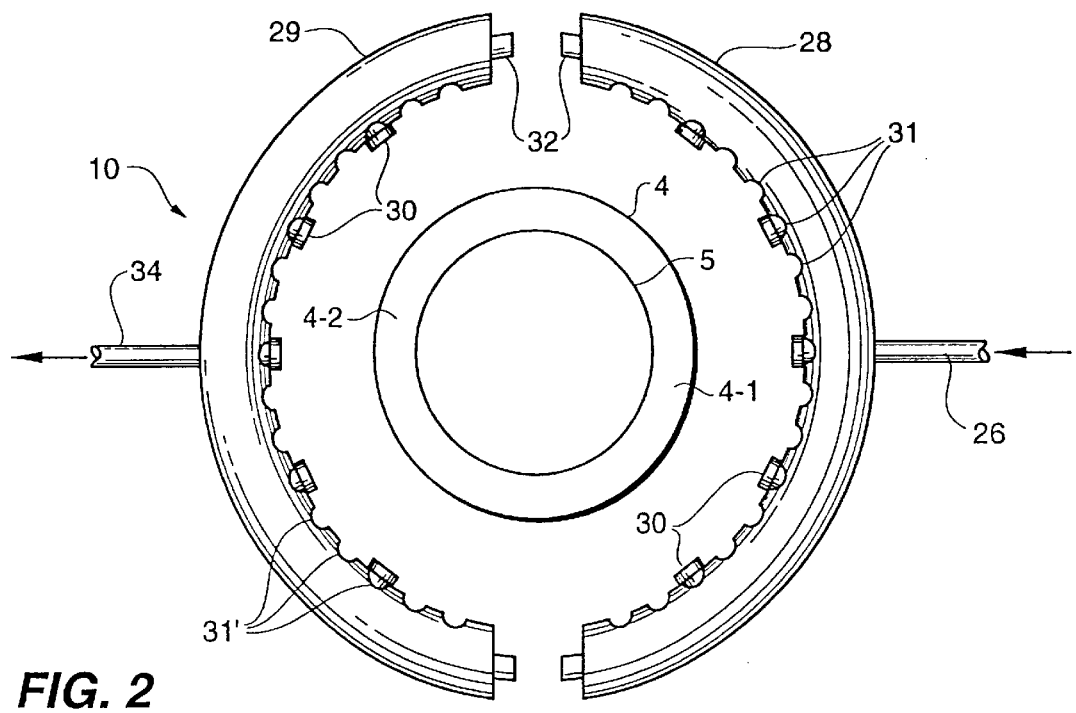
FIG. 2 is an enlarged plan view of an intake and exhaust nozzle assembly of the apparatus of FIG. 1.

The input nozzle assembly 8 and the exhaust nozzle assembly 10 are more particularly shown with reference to FIG. 2. Input nozzle assembly 8 includes an input tube 26 which receives a misted solution from manifold assembly 40 as discussed below in relation to FIG. 3. Input tube 26 is connected to arcuate tube 28 which has a plurality of small holes or input ports 31 for accepting removable screws 30 spaced ¼ inch center-to-center along the inner circumference of the tube 28.

Exhaust nozzle assembly 10 comprises an arcuate exhaust tube 29 having a plurality of small holes or exhaust ports 31' with removable screws 30. The structure of the exhaust nozzle assembly 10 is substantially the same as that of the input nozzle assembly 8, except that a tube 34 leads to a vacuum/exhaust source (not shown). End caps 32 of tubes 28 and 29 are removable for cleaning. Arcuate tube 28 of input nozzle assembly 8 and the corresponding arcuate tube 29 of exhaust nozzle assembly 10 respectively surround oppositely disposed peripheral portions 4-1, 4-2 of substrate holder 4.

In an exemplary embodiment wherein a layered superlattice material film is to be deposited, the centers of holes 31, 31+ in tubes 28 and 29 are nominally located 0.375 inches above substrate holder 4. However, referring to FIG. 1, this distance is adjustable using different lengths of shaft 20' to suit the specific deposition process.

Each of the tubes 28, 29, is typically fabricated from ¼" O.D. stainless steel, with an inner diameter of approximately 3/16". The interior walls of each tube 28,29 are preferably electro-polished. Holes 31, 31' in tubes 28 and 29 respectively are spaced approximately ¼" center-to-center, and are tapped to accommodate 4–40 (⅛") socket head set screws.

Through such structure, and by adjusting the location of open holes 31, 31' by selectively inserting or removing screws 30 in the two arcuate tubes 28 and 29, the flow of a vaporized solution or mist over the substrate 5 can be well controlled for various solutions and flow rates, etc., to achieve a uniform deposition of a thin film on substrate 5.

Referring to FIGS. 1 and 2, substrate holder 4, barrier plate 6, input nozzle assembly 8 and exhaust nozzle assembly 10 collectively cooperate to define a relatively small, semi-enclosed deposition area 17 surrounding an upper/exposed surface of the substrate 5, and within which the vaporized solution is substantially contained throughout the deposition process.

Although exemplary embodiments of substrate holder 4, barrier plate 6, input nozzle assembly 8 and exhaust nozzle assembly 10 are shown and described, it is understood that variations of such structures can be utilized within the scope of the present invention. For example, the arcuate input and exhaust tubes 28 and 29 could be replaced with tubes of other structures such as V-shaped or U-shaped tubes, or slotted tubes, or could simply be replaced by a plurality of separate nozzles and separate exhaust ports.

Figure 3:
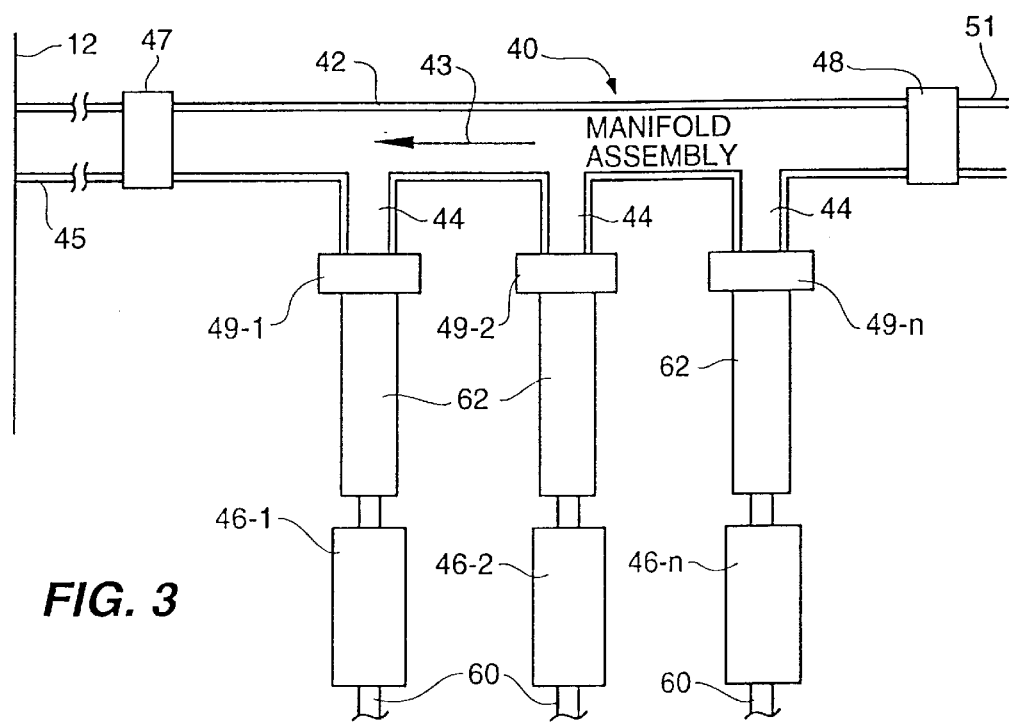
FIG. 3 is an enlarged schematic top view of a manifold system used in the apparatus of FIG. 1.

FIG. 3 shows a manifold assembly 40 according to the present invention. The manifold assembly 40 is utilized for supplying a mist to input nozzle assembly 8, and generally comprises a mixing chamber 42, a plurality of inlets 44 which are connected to corresponding mist generators 46-1, 46-2, through 46-n through respective valves 49-1, 49-2, through 49-n, a deposit valve 47 for regulating flow from the mixing chamber 42 to the nozzle assembly 8, and an exhaust vent valve 48. In use, one or more of the mist generators 46-* are utilized to generate one or more different mists which are then flowed into the mixing chamber 42 through valves 49-* and inlets 44.

The mists as flowed into the mixing chamber 42 are mixed to form a single, uniform misted solution which is then flowed into the deposition chamber 2 at an appropriate flow rate through the valve 47 and input tube 26. The general direction of flow in the mixing chamber 42 and tube 45 which connects manifold assembly 40 to input nozzle assembly 8 (FIG. 1) is shown by the arrow 43. Valve 47 can be selectively closed off so that the deposition chamber 2 can be pumped down if desired, or to clean and purge the manifold system when necessary. Similarly, the outlet 51 of the exhaust valve 48 is connected to a vacuum source (not shown) so that, when necessary to exhaust/purge one or more of the mist generators 46, valve 47 can be closed off, valve 48 and one or more of the valves 49-* can be opened, and the mixing chamber 42 can be pumped down to clean and purge the mist generator(s) 46-* and the mixing chamber 42 by applying a vacuum via outlet 51, or using standard negative draw type exhaust.

Figure 9:
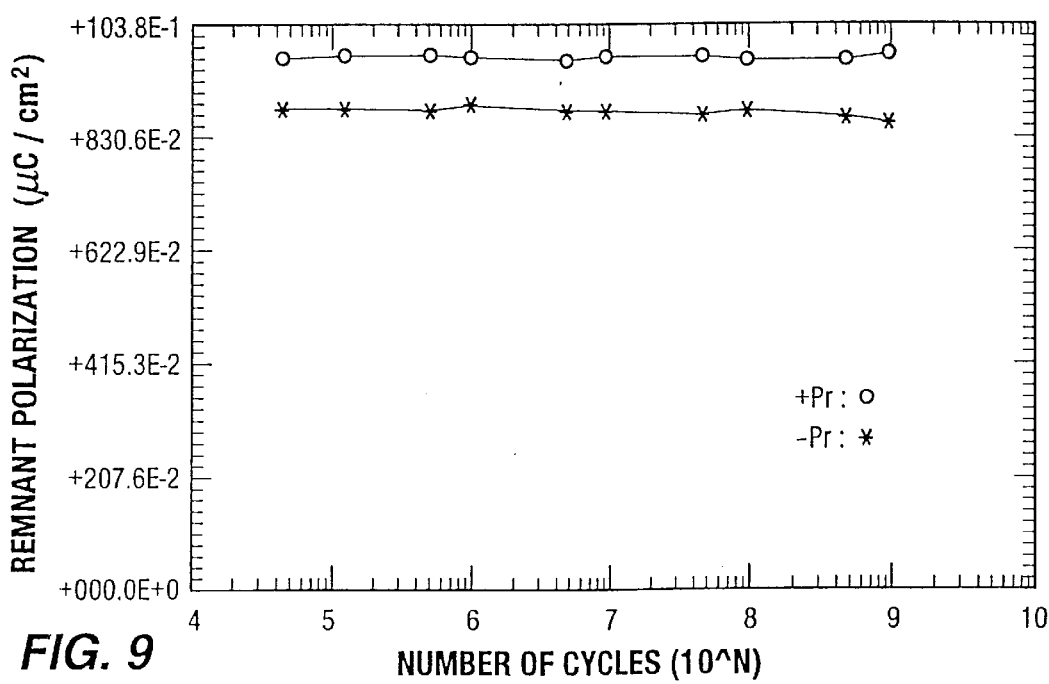
FIG. 9 is a graph of the measured remnant polarization versus number of switching cycles, i.e. a fatigue curve, for the strontium bismuth tantalate capacitor of FIG. 8.

Apparatus 1 shown in FIGS. 1, 7, and 9 includes electrical means 102 for applying a DC bias in the deposition chamber 2 during a deposition operation. FIG. 1 shows the DC input 104. The DC potential applied between input sleeve 25 and deposition chamber main body 12 is typically 350 volts. The DC bias achieves poling in-situ of the ferroelectric film adding to the film quality. Dipole ordering along the crystal c-axis (the major polarization axis) is often desirable, and the resulting ordering reduces dislocation density which can be responsible for fatigue and retention problems. A DC bias of either greater than or less than 350 volts could also be used to effectuate the above results. In addition, while deposition is occurring, combinations of ultraviolet radiation and DC bias may be applied within chamber 2 either together or sequentially, and repeated.

The above details or the apparatus 1 are sufficient to understand the process of the invention. Further details may be found in U.S. Pat. No. 5,456,945 issued Oct. 10, 1995.

2. Detailed Description of the Process

Figure 4:
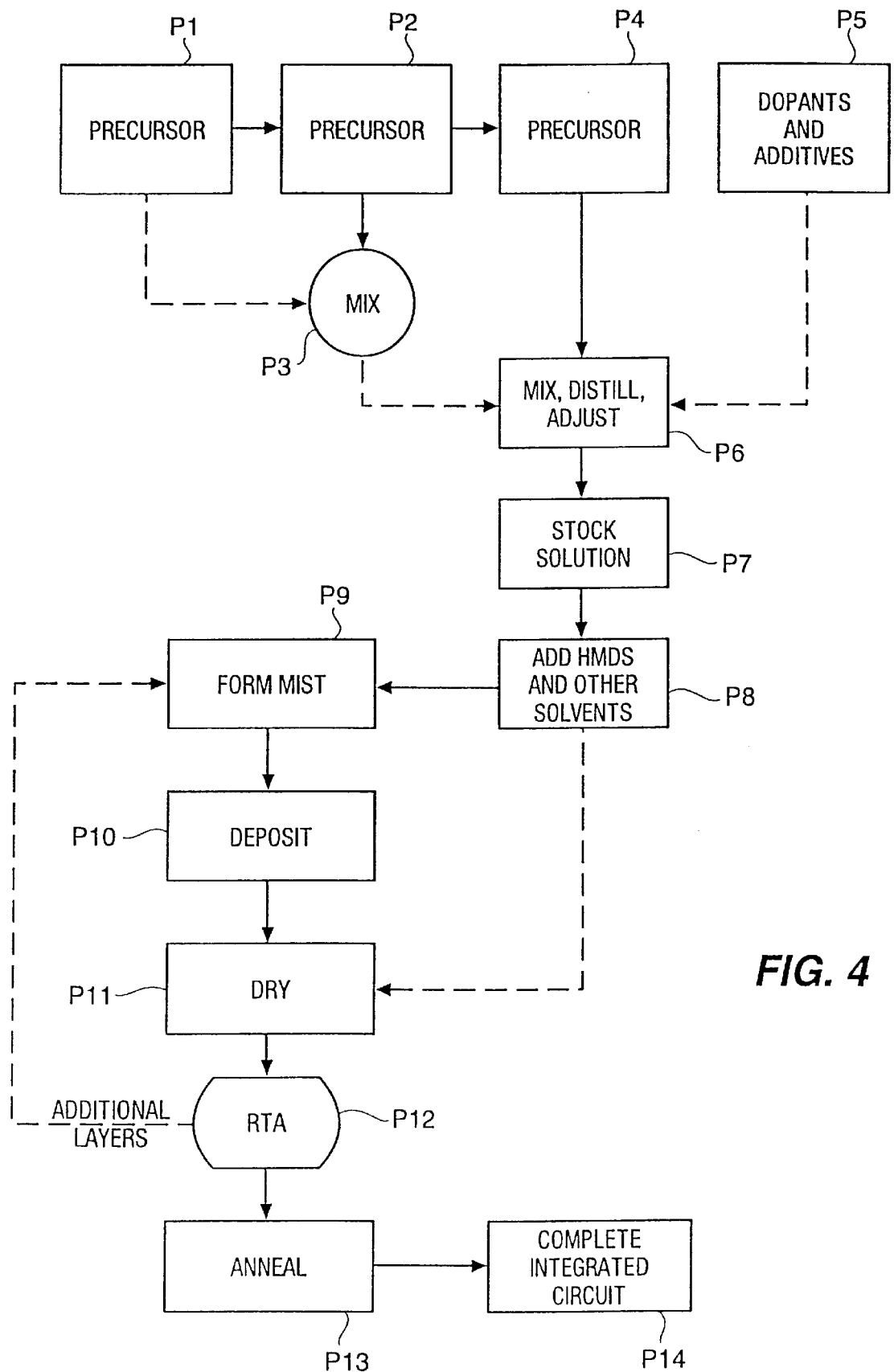
FIG. 4 is a flow chart showing the preparation of a layered superlattice material thin film according to the preferred embodiment of the invention.

Referring to FIG. 4, there is shown an exemplary flow chart depicting the fabrication of a layered superlattice material thin film according to the invention. In steps P1 through P6 the liquid precursor is made. The process shown in the preferred process for fabricating a layered superlattice material in which there are three metallic elements. In the preferred embodiment, in each of steps P1 through P3 an initial precursor is made by reacting a metal or metal compound with a carboxylic acid to form a metal carboxylate, which is dissolved in a solvent. That is, in this embodiment, the metal moiety is a metal carboxylate. The preferred carboxylic acid for the reaction is one having a medium-length ligand, such as b 2-ethylhexanoic acid, although others may be used. Preferably the solvent's boiling point should be within the range 110° C.–170° C. The preferred solvents are alcohols, such as 2-methoxyethanol, aromatic hydrocarbons, such as the xylenes and octane, and esters, such as n-butyl acetate, though any of the solvents in Table A may be used.

TABLE A

| Solvent | Boiling Point |
| --- | --- |
| xylenes | (bp = 138° C.–143° C.) |
| n-Butyl acetate | (bp = 126.5° C.) |
| octane | |
| N,N-dimethylformamide | (bp = 153° C.) |
| 2-Methoxyethyl acetate | (bp = 145° C.) |
| Methyl isobutyl ketone | (bp = 116° C.) |
| Methyl isoamyl ketone | (bp = 144° C.) |
| Isoamyl alcohol | (bp = 132° C.) |
| Cyclohexanone | (bp = 156° C.) |
| 2-Ethoxyethanol | (bp = 135° C.) |
| 2-Methoxyethyl ether | (bp = 162° C.) |
| Methyl butyl ketone | (bp = 127° C.) |
| Hexyl alcohol | (bp = 157° C.) |
| 2-Pentanol | (bp = 119° C.) |
| Ethyl butyrate | (bp = 121° C.) |
| Nitroethane | (bp = 114° C.) |
| Pyrimidine | (bp = 123° C.) |
| 1,3,5 Trioxane | (bp = 115° C.) |
| Isobutyl isobutyrate | (bp = 147° C.) |
| Isobutyl propionate | (bp = 137° C.) |
| Propyl propionate | (bp = 122° C.) |
| Ethyl Lactate | (bp = 154° C.) |
| n-Butanol | (bp = 117° C.) |
| n-Pentanol | (bp = 138° C.) |
| 3-Pentanol | (bp = 116° C.) |

The amounts of the metals used are usually proportioned so that an equivalent weight of each metal equal to the molecular weight of the metal in the stoichiometric formula for the desired layered superlattice material. An exception is lead. Generally an excess of lead of between 1% and 100%, preferably between 3% and 10%, of the equivalent stoichiometric amount is included because lead oxide has a higher vapor pressure than the other metals and a significant amount of lead evaporates as lead oxide during baking and annealing. Similarly, excess amounts of other materials, such as bismuth, thallium, and antimony, that evaporate or otherwise are lost in the process may be used. For bismuth excellent results have been obtained with from about 2% to 70% excess bismuth, with the best results being in the range of 10% to 40% excess, although this factor is strongly dependent on the details of the heating steps P11 and P12.

If it is desired to add dopants to the material, then initial precursor(s) of the dopant element(s) may be made in step P5 in a similar manner to the precursors made in steps P1–P3. Alternatively, the dopant(s) may be added in the mixing step P6.

The steps P1, P2, P3, and P4 are preferably performed by mixing the metal or other metal compound, such as a metal alkoxide, with the carboxylic acid and the solvent and stirring. Low heat of between about 70° C. and 90° C. may be added to assist the reaction and dissolving, but this is generally not necessary. The solid arrows indicate that generally, the chemist will perform all the steps P1, P2 and P3 in the same container; that is the first metal or metal compound, the first measure of carboxylic acid, and a first solvent are placed in a container, the metal or metal compound and carboxylic acid are reacted, and the reactant dissolved, the second metal or metal compound is then placed in the same container and additional carboxylic acid and solvent are added and stirred to react the second metal or metal alkoxide and dissolve the reactant, then the third metal or metal compound, third carboxylic acid, and third solvent are added, the metal or metal compound is reacted, and the reactant dissolved. In this process the most reactive metal or metal compound is preferably added first, the second most reactive metal or metal compound added second, and the least reactive metal or metal compound added last. It also may be desirable to perform the distillation step after each or some of the metal and/or metal compounds are reacted and dissolved. Alternatively, each metal and/or metal compound may be combined with a carboxylic acid and solvent, reacted, and dissolved in a separate container, the result distilled if desirable, and then the three separate solutions mixed in step P6. Variations and combinations of preparing the individual metal precursors separately or in the same container with or without distillation(s) may be used depending on the solvents used and the form in which metal element is readily available. In addition it should be understood that if the desired superlattice material includes only two metallic elements, then only two metals or metal compounds will be reacted and dissolved, and if the desired superlattice material includes four or more metallic elements, then four or more metals or metal compounds will be reacted and dissolved. Further, it is understood that any of the steps P1, P2, and P3 may be replaced by using a preprepared metal carboxylate. In addition, many other processes for preparing the initial precursor may be used, as for example the variations discussed in U.S. Pat. No. 5,468,679 issued Nov. 21, 1995.

When the solution of reacted and dissolved metal carboxylates has been prepared, the precursor solution is then mixed and distilled in step P6 by heating and stirring the solution to further the reaction of the reagents, reduce the solution to the desired volume and viscosity, which may depend on whether the solution is to be stored or used immediately, and/or to remove certain liquids, such as water. Generally, if it is desirable to remove certain liquids, the solution is heated to a temperature above the boiling point of the liquids to be removed and below the boiling point of the liquids that are desired to be retained. The solution is distilled until all the solvents that are desired to be removed have evaporated and a desired volume and viscosity are reached. It may be necessary to add the desired solvent several times in the distilling process to remove all undesired solvents and obtain the desired volume and viscosity. Preferably, as much water as possible is distilled out so that the resulting initial precursor is essentially anhydrous.

Optionally, either separately or in combination with the step P6, a solvent exchange step may be performed. In this step a solvent, such as xylene, is added and the other solvents are distilled away. This solvent exchange step may be performed as the final step in preparation of the precursor prior to storing to change to a solvent that stores well, and or just before the misting step P9 to change to a solvent that deposits well, or both. If It is known that a certain solvent, such as xylene, will be preferable, the solvent may be added with the other solvents in steps P1, P2, P3, P4 and/or P5 and the other solvents distilled away in the distillation step P6.

Just before forming the mist, in step P8, an initiator may be added to the precursor. An initiator is a high vapor pressure, low boiling point, solvent that assists in initiating the formation of the mist. Preferably, the metal moieties in the precursor are also soluble in the initiator, that is, the initiator is a solvent for the metal moieties. A liquid with a boiling point of between about 50° C. and 100° C. is preferred as an initiator. Examples of liquids that may be used as initiators are given in Table B.

TABLE B

| Initiator | Boiling Point |
|---|---|
| Methyl Ethyl Ketone (2-butanone) | 80° C. |
| Isopropanol | 82° C. |
| Methanol | 64.7° C. |
| Tetrahydrofuran | 67° C. |

Examples of the preparation of layered superlattice precursor solutions are given in U.S. Pat. No. 5,423,285 issued Jun. 13, 1995. Precursors for layered superlattice materials made by the processes described above are now commercially available from Kujundo Chemical Laboratory Co. Ltd. (KJC), No. 1-28 5 Chome, Chiyoda, Sakado-shi, Saitama pref., Japan.

EXAMPLE 1

In the preferred process, 6.5 milliliters (ml) of KJC-Strontium Bismuth Tantalate-34611 F solution, including bismuth, strontium and tantalum 2-ethylhexanoates in xylenes, was mixed with 5.5 ml of methyl ethyl ketone (MEK), to which was added 2 ml of hexamethyl-disilazane. This final precursor solution was placed in mist generator 46-1. The deposition chamber 12 was pumped down to $10^{-6}$ Torr. Substrate rotation motor 18 was turned on to rotate substrate holder 4 at 60 cycles a minute. UV source 16 was then turned on for 30 minutes to desorb the moisture in the deposition chamber as well as any moisture on the substrate. The deposition chamber was slowly back filled with an inert nitrogen gas to a pressure of approximately 595 Torr. Next, the process vacuum line was opened to stabilize the deposition chamber pressure at approximately 595 Torr. In step P9 deposit valves 49-1 and 47 were opened, argon gas was passed through ultrasonic mist generator 46, and the mist generator was then turned on to form the mist. In step P10, the mist was flowed into the deposition chamber 12 for 9 minutes and deposited on a substrate 5 comprising a silicon wafer 622 with layers of silicon dioxide 624, titanium 626, and platinum 628 deposited on it. The UV source 16 was left on through this process. The wafer 600 was removed from the deposition chamber 12 and placed on a hot plate where it was dried in step P11 at a temperature of 150° C. for one minute, then processed by rapid thermal anneal (RTA) at 725° C. for 30 seconds in oxygen in step P12. The first layer thickness was 900 Å. Then the wafer 600 was returned to the deposition chamber 12, the mist was formed again and steps P9 and P10 another layer was deposited for six minutes. The wafer was then removed and baked at 260° C. for four minutes, and again RTA processed at 725° C. for 30 seconds in oxygen, and then, in step P13, annealed in oxygen for one hour. The resulting film 506 was approximately 1400 Angstroms (Å) thick.

At the end of each of the two coating processes, the mist generator 46-1, UV source 16, and substrate rotation motor 18 were turned off, deposit valve 47 was closed, mist generator 46-1 was turned off, and manifold 40 was vented until mist generator 46-1 reached ambient temperature. At the end of the entire deposition process, manifold 42 was purged through vent 705 with argon gas.

After the anneal step P13, the IC device 600 was completed in step P14, i.e. second platinum electrode 632 was sputtered on and the wafer was then etched using well-known photo-resist techniques to produce a plurality of capacitors 604.

Figure 8:
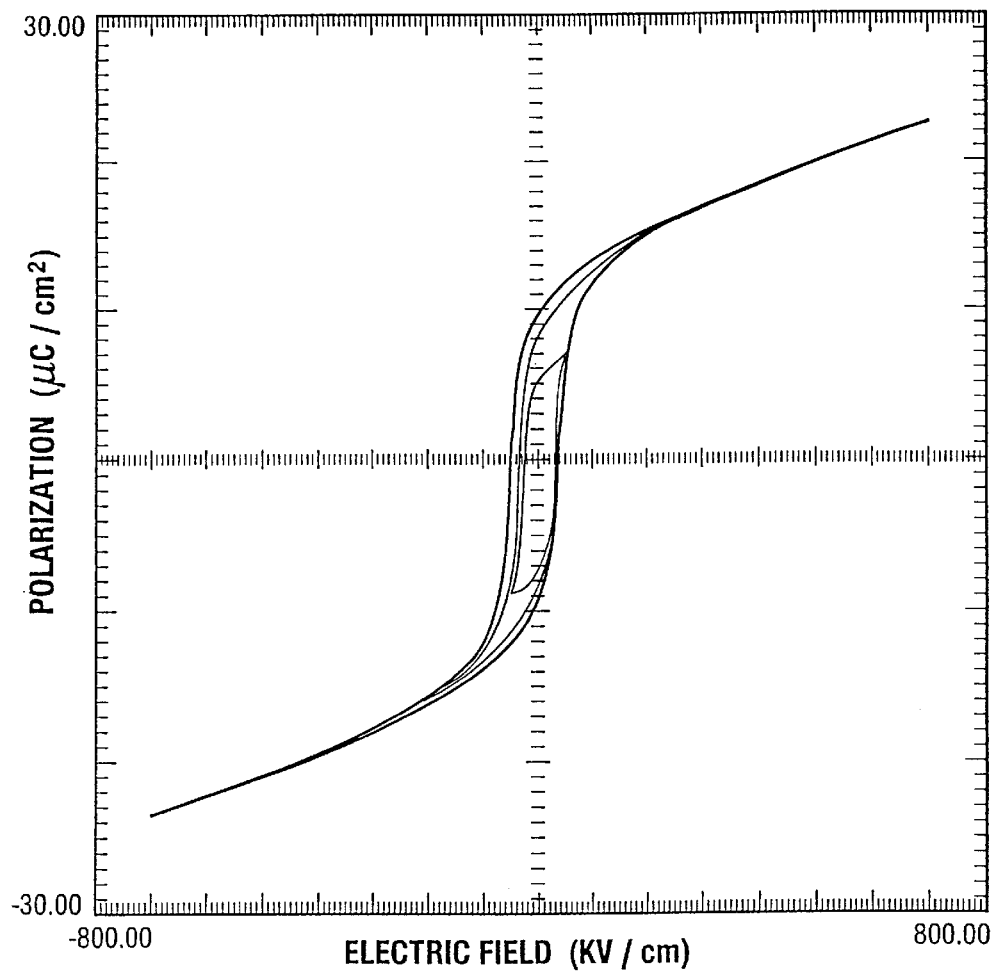
FIG. 8 is a graph of the measured polarization as a function of electric field for a strontium bismuth tantalate capacitor made according to the process of the invention.

Hysteresis measurements were made on the strontium bismuth tantalate capacitor fabricated by the above process using an uncompensated Sawyer-Tower circuit at 10,000 Hertz and at voltages of 1 volt, 3 volts, 4 volts, 5 volts, 6 volts, 7 volts, 8 volts, 9 volts, and 10 volts. The results for room temperature are shown in FIG. 8. The ordinate is the polarization in microcoulombs per square centimeter while the abscissa is the applied electric field in kilovolts per centimeter. The hysteresis curves indicate the capacitors would perform well in a memory. Almost all the curves except the 1 volt curve fall one on top of the other, showing that the electrical properties remain remarkably constant over the range of voltages common to integrated circuits. The polarizability, 2Pr, is over 19 microcoulombs/cm$^2$ for the 5 volt measurement and about the same for all voltages from 3 to 10 volts. The coercive field, 2Ec, was about 85 volts for the 5 volt measurement, and about the same for all voltages from 3 to 10 volts.

FIG. 9 shows a graph of the remnant polarizations, +Pr and −Pr, in microcoulombs per centimeter squared versus the number of switching cycles for the sample made by the process described above, also at room temperature. The measurements were made at 10,000 and a million hertz with an amplitude of 5 volts using a triangular wave. Both curves are essentially flat out to 10$^9$ cycles. These curves are generally referred to in the art as fatigue curves, since any decrease in these curves indicates that the ferroelectric properties is declining with increasing number of switching cycles, which is referred to as fatigue of the ferroelectric material. Prior to the discovery of the extraordinary properties of the layered superlattice materials by some of the present inventors, all known ferroelectric materials fatigued 50% or more over the range shown in the graph. The graph shows that strontium bismuth tantalate made by the process of the invention retains the same resistance to fatigue while also having good step coverage.

Figure 10:
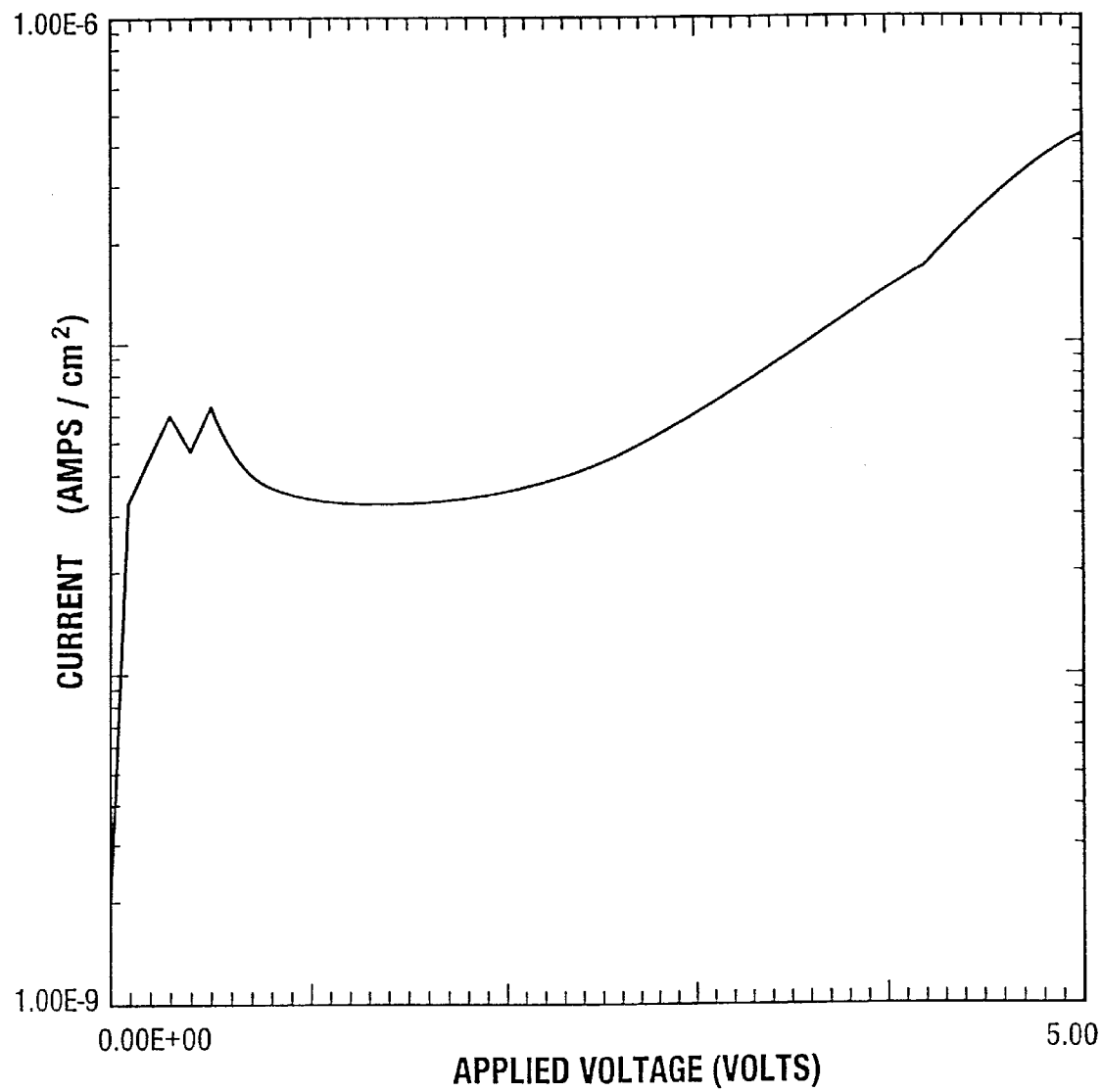
FIG. 10 is a graph of the leakage current versus applied voltage for the strontium bismuth tantalate capacitor of FIG. 8.

The measured leakage current at room temperature in amperes per square centimeter versus applied voltage in volts for the same sample is shown in FIG. 10. The leakage current stays well below 10$^{-6}$ amps per square centimeter for all measured voltages.

FIG. 5, discussed above, is a drawing of an electron micrograph of an actual layer of strontium bismuth tantalate deposited on a platinum substrate as described in Example 1.

The above results are all excellent, and are comparable to the best results obtained for strontium bismuth tantalate for flat capacitors. Thus, the use of hexamethyl-disilazane provides excellent step coverage while retaining extraordinary electrical properties.

EXAMPLE 2

As a check on the results, a second set of samples was made using the same process described above, except that the hexamethyl-disilazane was omitted. All samples showed blue spots, which upon magnification proved to be thickness variations. The Polarizability, 2Pr, was typically about 14 microcoulombs per centimeter squared, although a few showed results the same as those given above, indicative of variations in coverage of the substrate by the superlattice material. Photomicrographs confirmed the poor step coverage. While variations of the precursor and other portions of the process could be found that produced good electrical results, no variation, other than the use of hexamethyl-disilazane could be found that produced uniform thickness and good step coverage.

EXAMPLE 3

A third set of samples was made using the same process as described in Example 1 except that a strontium bismuth tantalum niobate solution was used. The step coverage was essentially the same as for the strontium bismuth tantalum capacitor samples of Example 1. Because of the excellent appearance, it is expected that the electronic properties will be likewise excellent, though these have not yet been measured at this time.

Although there has been described what is at present considered to be the preferred embodiments of the present invention, it will be understood that the invention can be embodied in other specific forms without departing from the spirit or essential characteristics thereof. Now that the advantage of using hexamethyl-disilazane in the above liquid precursor deposition process has been disclosed, the solvent may be found useful for other liquid deposition processes. The present embodiments are, therefore, to be considered as illustrative and not restrictive. The scope of the invention is indicated by the appended claims.

We claim:

1. A method of fabricating a thin film of a layered superlattice material, said method comprising the steps of:
   (a) providing a liquid precursor including: a plurality of metal moieties in effective amounts for forming a layered superlattice material; and hexamethyl-disilazane;
   (b) placing a substrate inside an enclosed deposition chamber;
   (c) producing a mist of said liquid precursor;
   (d) flowing said mist through said deposition chamber to form a layer of the precursor liquid on said substrate; and
   (e) treating the liquid layer deposited on said substrate to form a solid film of said layered superlattice material.

2. A method as in claim 1 wherein said step of flowing is performed while maintaining said deposition chamber at ambient temperature.

3. The method of claim 1 wherein said layered superlattice material comprises a material selected from the group consisting of strontium bismuth tantalate, strontium bismuth niobate, and strontium bismuth tantalum niobate.

4. The method of claim 1 wherein said metals include a metal selected from the group consisting of strontium, calcium, barium, bismuth, cadmium, lead, titanium, tantalum, hafnium, tungsten, niobium, zirconium, scandium, yttrium, lanthanum, antimony, chromium, and thallium.

\* \* \* \* \*